United States Patent

[11] 3,617,773

[72] Inventor Arnaud Michael Eccles
Stafford, England
[21] Appl. No. 794,146
[22] Filed Jan. 27, 1969
[45] Patented Nov. 2, 1971
[73] Assignee The English Electric Company Limited
London, England
[32] Priority Jan. 25, 1968
[33] Great Britain
[31] 3976/68; Jan. 25, 1968, 3977/68

[54] THYRISTOR GATING CIRCUITS
7 Claims, 6 Drawing Figs.

[52] U.S. Cl. .......... 307/252 C, 307/252 N, 307/311, 307/268, 307/254
[51] Int. Cl. .......... H03k 17/72, H03k 17/06
[50] Field of Search .......... 307/252, 311, 268, 254

[56] References Cited

UNITED STATES PATENTS

| | | | |
|---|---|---|---|
| 3,201,764 | 8/1965 | Parker | 307/252 |
| 3,174,096 | 3/1965 | Lichowsky | 307/252 |
| 3,335,294 | 8/1967 | Chauprade | 307/252 |
| 3,343,005 | 9/1967 | Chauprade | 307/252 |
| 3,448,300 | 6/1969 | Gyugyi | 307/252 |
| 3,457,433 | 7/1969 | Watson | 307/252 |
| 3,502,910 | 3/1970 | Johanson-Brown | 307/252 |

*Primary Examiner*—Donald D. Forrer
*Assistant Examiner*—Harold A. Dixon
*Attorney*—Misegades & Douglas

ABSTRACT: A thyristor gating circuit embodying a bistable circuit and a constant current stage, the bistable being activated by light-responsive control signals so as selectively to provide through this stage a constant current output of positive polarity for maintaining the thyristor conductive, and a constant current output of negative polarity for "blocking" the thyristor. A sharp positive impulse is initially produced to gate-on the thyristor during each cycle, this impulse either being developed directly in response to the control signal or being produced by resistance—Capacitance circuits coupled to the bistable.

THYRISTOR GATING CIRCUITS

This invention relates to thyristor gating circuits, and more particularly relates to such circuits for simultaneously gating-on a number of thyristors connected together in a series string.

According to this invention, there is provided a gating circuit for a thyristor comprising a bistable circuit and control means responsive to a first signal to switch the bistable circuit into one state in which it is operable to develop an initial sharp impulse of one polarity for gating-on said thyristor together with a constant current output of said one polarity conjoined with but of lower level than said impulse for maintaining the gate drive on the thyristor, and responsive to a second signal to switch the bistable into its other state in which it is operable to develop a constant current output of the opposite polarity for reversing the gate drive on the thyristor.

The bistable circuit may be a multivibrator connected to first and second constant current stages for developing said outputs of the one and other polarities, respectively, these two stages being connected to stabilized supplies of the appropriate polarities, with the multivibrator being operable to drive the first constant current stage through a "peaking" circuit for developing the sharp impulses.

The control means may include pulse transformers separately energized by the first and second signals and they may additionally include photoresponsive elements connected to these pulse transformers, the first and second signals being light beams. With such light signals, the pulse transformers may be omitted, photoresponsive elements being connected directly to the bistable circuit. The "light" may in fact be laser beams and may be directed through filamentary light guides.

The invention also provides a gating circuit for a thyristor comprising a drive circuit operable in response to a first input signal to develop a sharp impulse of one polarity for gating-on said thyristor, and a bistable circuit, the bistable circuit being operable to assume one state in response to said first signal and develop a constant current output of the said one polarity conjoined with but of lower level than said impulse for maintaining the gate drive on said thyristor, and operable to assume its other state in response to a second input signal and develop a constant current output of the opposite polarity for reversing the gate drive on said thyristor.

The invention is of particular utility in thyristor bridge networks, in AC–DC converters where a number of thyristors in each bridge arm are connected together in a series string across a supply source and are all required to be gated-on simultaneously, and in this instance a separate gating circuit is associated with each thyristor. The power supply for these circuits may conveniently be derived from a divider chain comprising a corresponding number of auxiliary circuits connected in series across the main supply source, and where pulse transformers are employed their driving stages may also be powered by these auxiliary circuits. In this latter instance, only one driving stage may be used as a center feed for energizing all the pulse transformers for developing the first input signals and one other driving stage may be used for energizing all the pulse transformers for developing the second input signals.

The invention thus provides a gating circuit for developing a continuous drive to the thyristors as distinct from the short single gate pulse used in previous systems, the continuous drive being recurrent and comprising a fast rise, high-current pulse of, e.g., positive polarity, initiated by the first input signal followed by a constant current positive level and finally a negative constant current level initiated by the second input signal. The fast rise pulse is designed to gate-on the thyristors and the following positive constant current level is maintained just above this gating level. The negative level may be fixed empirically and is effective during the thyristor blocking period, this portion of the signal being operative to swamp any extraneous signals which might otherwise tend to gate-on the thyristors and additionally being effective to stabilize the thyristor blocking characteristics and shorten the turnoff times.

In order that the invention may be fully understood, it will now be described, by way of example, with reference to the accompanying drawings, in which:

FIG. 1A and 1B together show a series string of thyristors connected across supply terminals and arranged to be gated-on simultaneously in response to light signals;

Figure 1A:
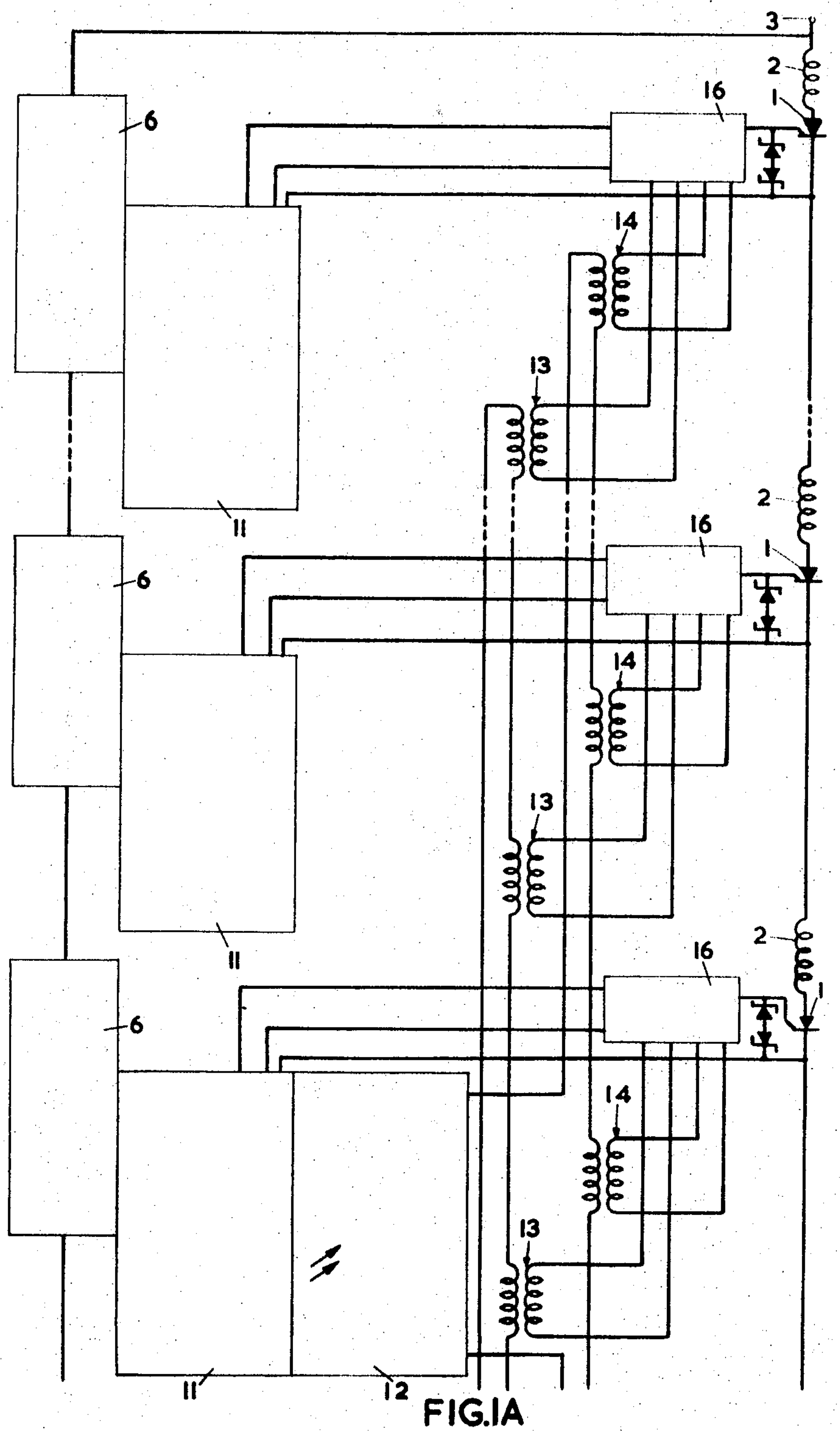
Figure 1B:
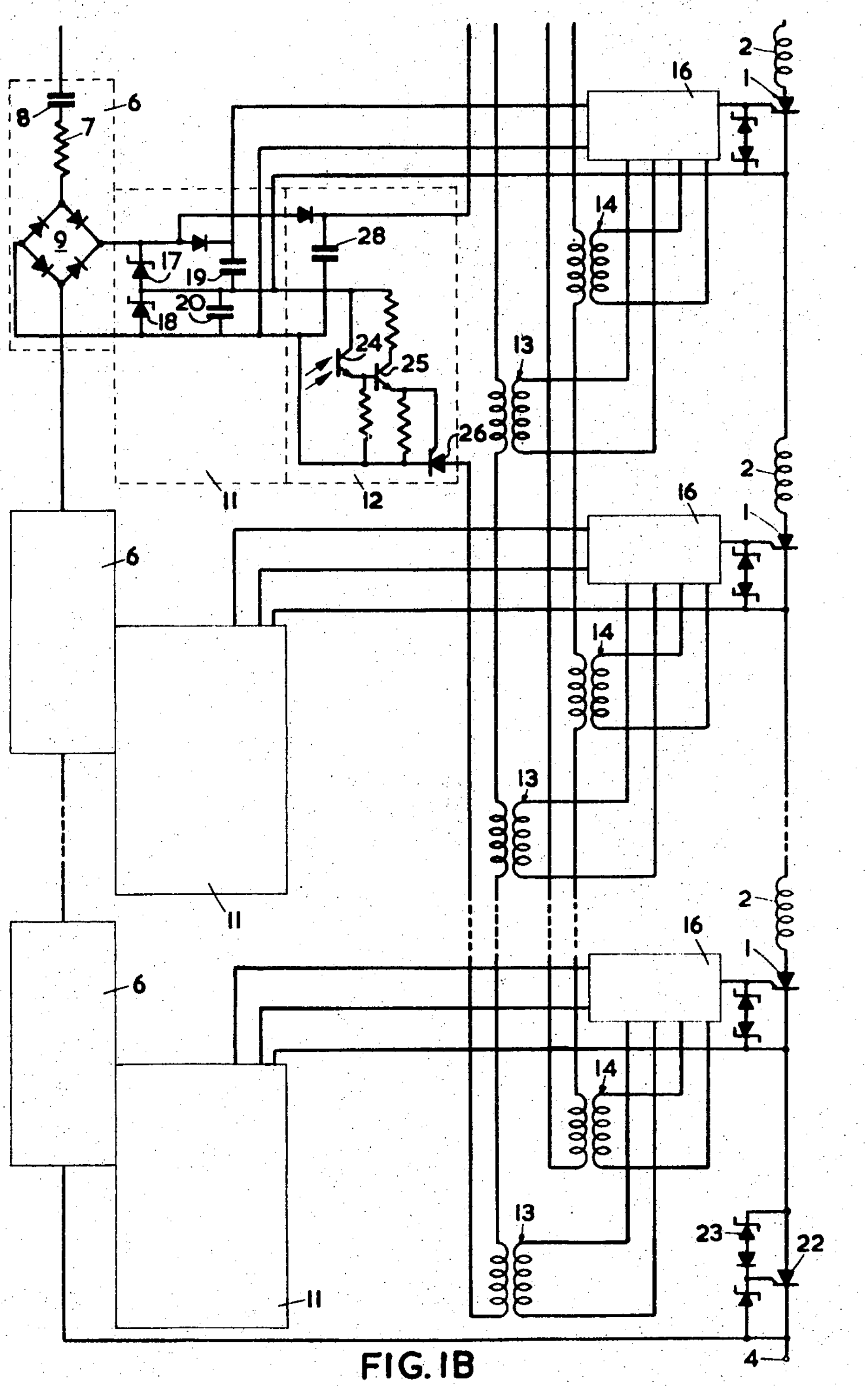

Referring now to FIGS. 1A and 1B a series string of thyristors 1 and their associated di/dt limiting inductors 2 are connected between supply terminals 3 and 4 in, for example, an AC–DC converter. Connected in parallel with this series string are a corresponding number of auxiliary voltage-sharing networks 6 each comprising a resistor 7 and capacitor 8, together with a bridge rectifier 9 for developing a DC power supply for gating circuits associated with each thyristor. In particular, these circuits comprise an auxiliary supply network 11 for both energizing a driving stage 12 for pulse transformers 13, 14 and developing a bi-polar voltage (with respect to the cathode of thyristor 1) for gate control circuits 16.

The bi-polar voltage is derived from two zener diodes 17, 18 connected across the DC output from the bridge rectifier 9, the junction between these diodes being connected directly to the cathode of the associated thyristor 1 while the related positive and negative voltages are applied to the control circuit. The two zener diodes 17, 18 are bridged by storage capacitors 19, 20, respectively, and in order to permit capacitor 19 to charge fully in that supply network associated with the end thyristor 1 in the series string an additional thyristor 22 is introduced into this string. Without this thyristor 22, a permanent discharge path for capacitor 19 would be created through the bridge rectifier 9.

A separate gating circuit is provided for the thyristor 22, this thyristor being automatically gated-on in response to the conduction of the other thyristors 1 by breakdown of a zener diode 23, the zener voltage of this diode being at a lower level than that of the zener diode 18 in order to ensure that the main load current does not alternatively flow directly through the supply network 11.

The two driving stages 12 for the pulse transformers 13, 14 are, as mentioned above, energized by this supply network 11, and each comprise a phototransistor 24 followed by an emitter-follower 25 for firing a thyristor 26 and thus discharging a storage capacitor 28 into the primary windings of the appropriate transformers 13, 14. The phototransistors 24 in these two stages are light-fired in succession, the output from pulse transformer 13 being employed as an "ON" gating signal for the thyristors 1 and the output from pulse transformer 14 being used as an "OFF" signal.

Figure 2:
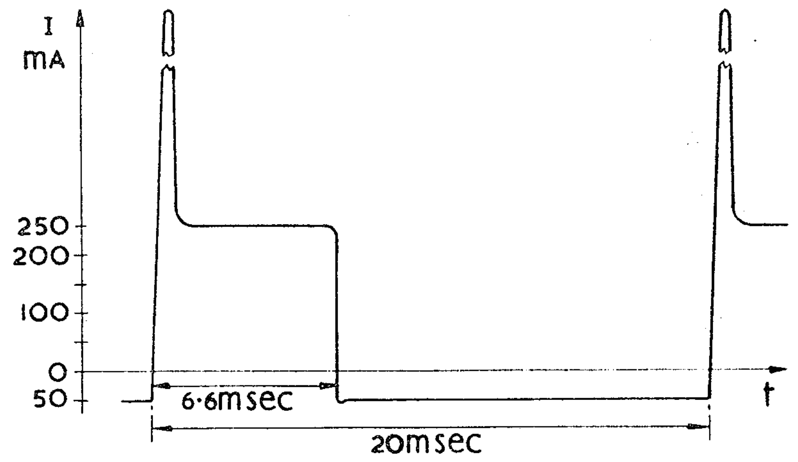
FIG. 2 is a graphical illustration of the gating waveform for the thyristors.

In particular, these pulse outputs are fed to the gate control circuit 16 which is designated to produce an output current of the form shown in FIG. 2, that is, an initial fast rise-time, high-current pulse followed by a constant current positive gate drive during the conduction period of thyristor 1 and a constant current negative gate drive during its blocking period.

Figure 3:
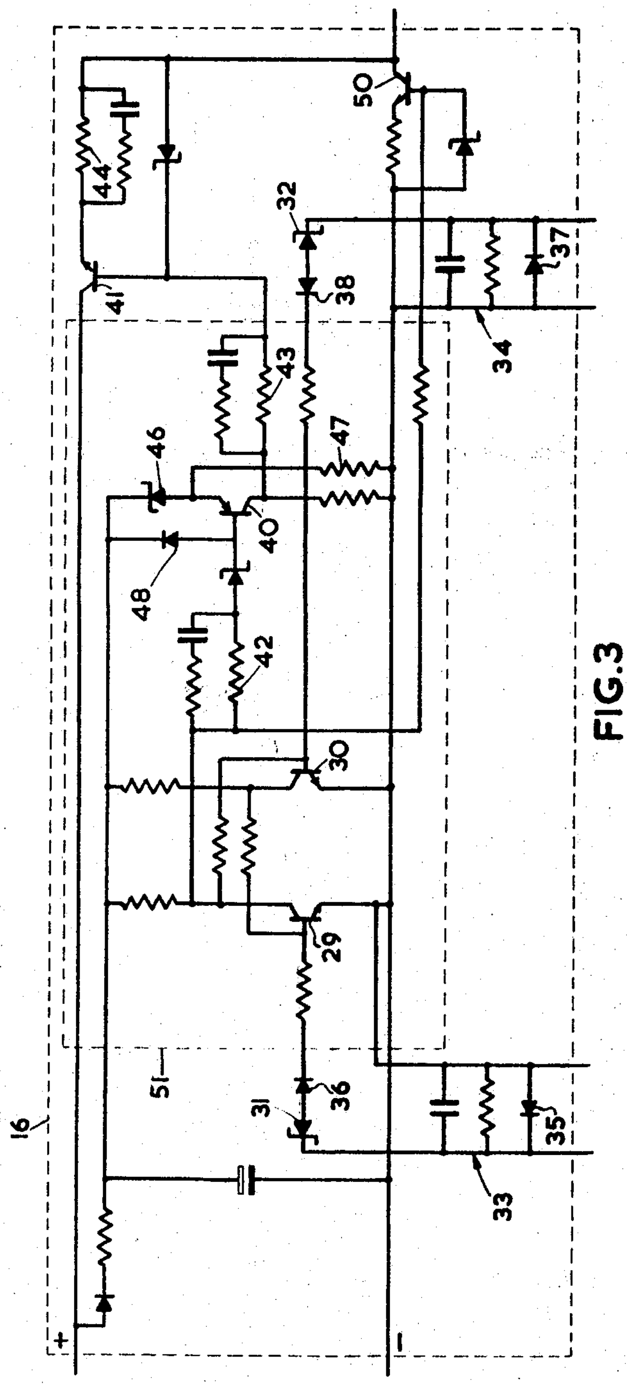
FIG. 3 is a detailed circuit diagram of gate control circuits shown in FIG. 1A and 1B.

The gate control circuit is shown in detail in FIG. 3 and referring now this FIG., multivibrator comprising two transistors 29, 30 receives its "ON" signal from transformer 13 via a zener diode 31 and its "OFF" signal from transformer 14 via a zener diode 32. These diodes will not conduct until the voltage across their associated resistor-capacitor networks 33, 34 exceeds their zener breakdown voltage; thus, by choosing appropriate values, a current threshold can be selected which is safely above the level of any stray currents to be expected. In addition diodes 35, 36, 37, 38 are provided to eliminate the affects of the negative-going "resetting" voltage from transformers 13, 14.

At the onset of the "ON" period, the input pulse form transformer 13 is applied to transistor 29 in the multivibrator, switching it on, and the output from this transistor switches on a further transistor 40 the output from which is, in turn, amplified by a transistor 41 in a "positive" constant current stage before application to the gate electrode of thyristor 1. The DC current drive to these transistors is through resistors 42, 43 which are each bypassed by a series RC circuit so as initially to give the short turn-on high current drive as mentioned; further "peaking" is obtained by a series circuit connected across the emitter resistor (44) of transistor 41. When transistor 29 is switched-on, the other transistor 30 in the multivibrator is, of course, switched-off.

In this "steady-state" condition, then, a continuous positive gate drive is applied to the thyristors through the constant current stage, all the thyristors in the string being fired simultaneously by the initial high-current pulse peak.

At the instant the thyristor string is turned-off (blocked), determined by the polarity of the voltage across the supply terminals 3 and 4 or commutation to another string, an input pulse from transformer 14 is applied to transistor 30 in the multivibrator switching it "on" and switching-off transistor 29. With transistor 29 off, transistor 40 is switched off and with it transistor 41 in the positive constant current stage, transistor 40 being definitely turned-off as a result of the provision of a zener diode 46 and a resistor 47 which together ensure that the emitter potential lies below the level of the positive supply line towards which the base is raised when transistor 29 is turned off; in addition, a diode 48 prevents the base of transistor 40 rising above the level of this supply line. At the same time, the switching of this latter transistor causes a transistor 50 in a "negative" constant current stage to be switched "on" thereby causing the negative current "-blocking" portion of the gate pulse to be applied to the thyristor 1.

As shown in FIG. 2, the output current from these gate control circuits may initially rise to a value of several amps and then remain constant at say 250 ma. before being driven negative to a constant value of about 50 ma. The positive value is chosen to be just above the maximum required to fire all the thyristors and the negative value is chosen to be sufficient to swamp the affects of any stray earth currents on the blocking characteristics of the thyristors. The width of the sharp initial pulse may be of the order of 80 $\mu$sec. with a rise time as small as 0.4 $\mu$secs., and in the example given the thyristors are considered in respect of their use in a three phase bridge converter with an "ON" period for each string of approximately 6.6 msecs during each cycle of an AC system with a frequency of 50 c/s.

Figure 4:
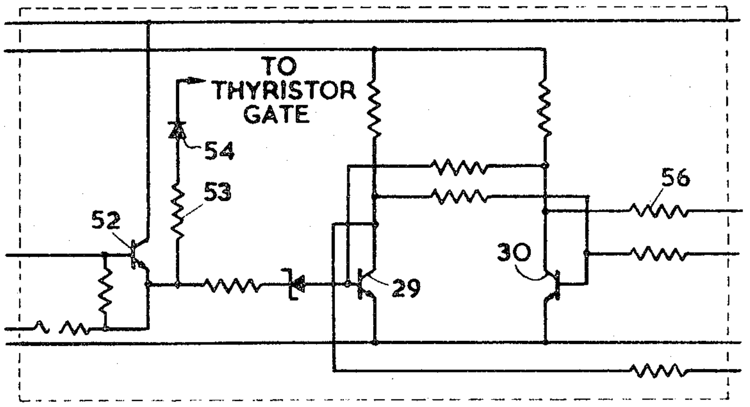
FIG. 4 is a modification of part of the gate control circuit shown in FIG. 3.

It is to be understood that various modifications may readily be made to the circuits described without departing from the scope of this invention and, for example, one such modification is shown in FIG. 4 which illustrates an alternative to the high-current drive and multivibrator circuitry 51 employed in the gate control circuit shown in FIG. 3.

Basically this unit comprises a transistor 52 which is switched-on in response to an input pulse from transformer 13 and its resulting output is applied directly to the gate electrode of thyristor 1 as a high-current pulse via a resistor 53 and a blocking diode 54. At the same time, transistor 29 in the multivibrator is switched-on, switching-off transistor 30 and causing transistor 41 in the positive constant current stage (FIG. 3) to be switched-on through a resistor 56, thus applying the constant current pulse to thyristor 1. Following this, an input pulse from transformer 14 at the appropriate instant causes transistor 30 to be switched-on whereupon transistor 41 is switched-off as well as transistor 29 which results in transistor 50 in the negative constant current stage (FIG. 3) being switched-on. Accordingly, a negative pulse is thus applied to thyristor 1.

The actual current drive characteristics with this modified circuit are similar to those shown in FIG. 2 but there is an absence of the exponential form of the initial high-current positive pulse. However, whereas with the circuit shown in FIG. 3 all the "drive" transistors for the positive constant current stage, namely, transistors 29 and 40, are turning-on during the onset of the "ON" cycle for thyristor 1, thus enabling the signal from pulse transformer 13 to be applied directly to the multivibrator, this is not the case with the FIG. 4 circuit, (transistor 30 is active here and is switched-off). Consequently, the input signal from the pulse transformer must be applied direct to the separate high-current drive circuit in FIG. 4, as described, so as to avoid the affect of comparatively long transistor turnoff times on the initial rise time of the current drive pulse but the coherence or continuity of the initial high-current pulse with the following constant current"section" may not be as satisfactory here as in the other embodiment.

Figure 5:
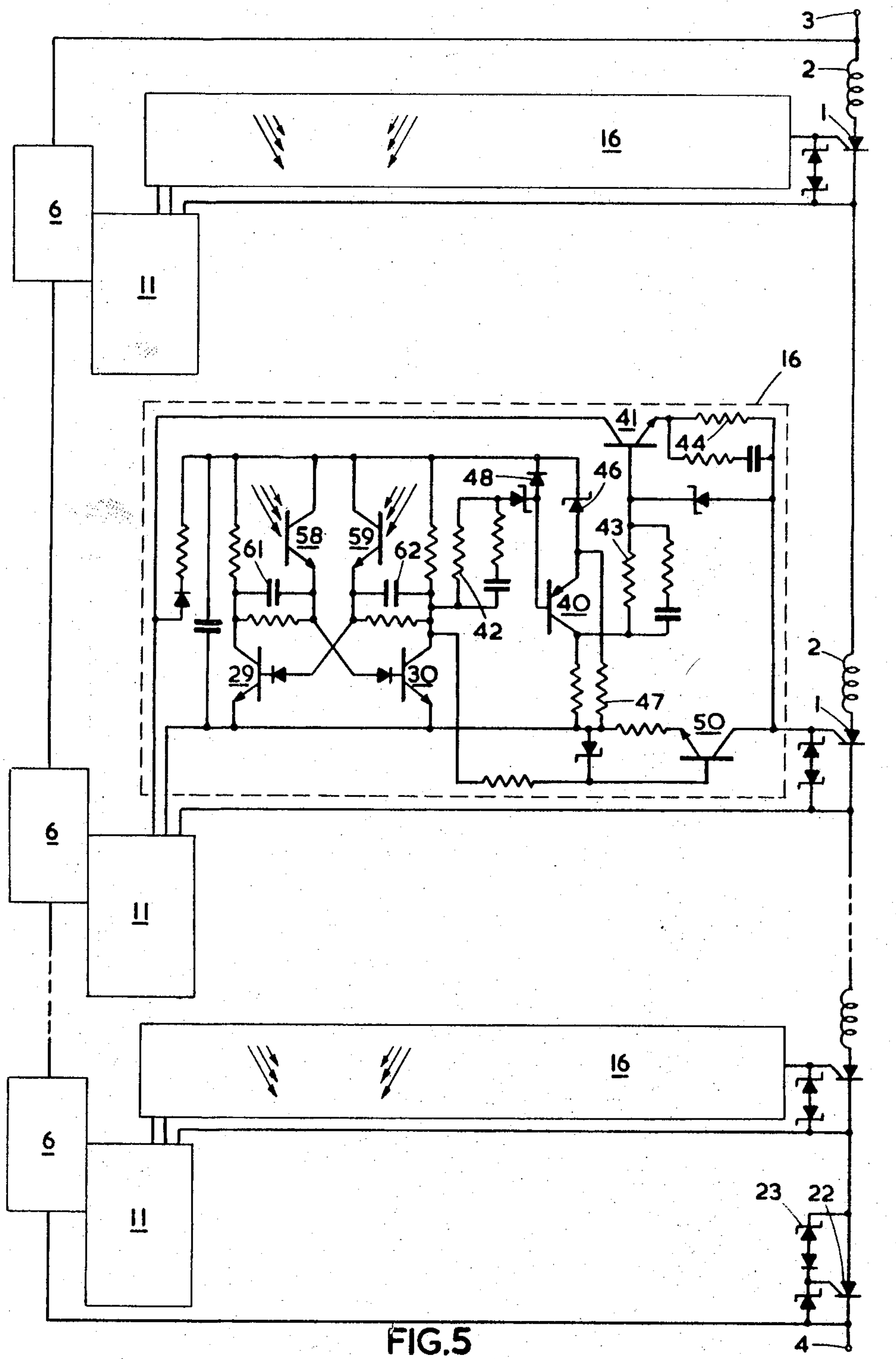
FIG. 5 is a modification of the circuit shown in FIGS. 1A and 1B in which light signals are applied directly to the gate control circuits.

Another modified circuit is shown in FIG. 5, in which the pulse transformers are omitted and the gate control circuits 16 are light activated directly. These gate control circuits are slightly different from those described above and in this instance the multivibrator receives its "ON" signal from a light-activated phototransistor 58 and its "OFF" signal from a light-activated phototransistor 59, these phototransistors being fired successively. The output waveform from this circuit is the same as that shown in FIG. 2.

In operation, at the onset of the "ON" period, phototransistor 58 is irradiated, switching-on transistor 30 so that a negative signal is applied to the base of the transistor 40 turning this "on" also. In turn, the output from this transistor switches-on the transistor 41 which, as before, gates-on its associated thyristor 1 in the series string, the initial sharp impulse being produced in the same manner as described with reference to FIG. 3.

When the transistor 30 is switched-on, the other transistor 29 in the multivibrator is switched-off and capacitors 61, 62 are connected across the two coupling resistors in this stage in order to speed up the changeover in response to the very short light pulse available for the phototransistors.

At the instant the thyristor string is turned-off (blocked) phototransistor 59 is irradiated, switching-on transistor 29 in the multivibrator and switching-off transistor 30. With transistor 30 off, transistor 40 is switched off and with it transistor 41. At the same time, the switching of transistor 40 causes the transistor 50 to be switched on, applying the negative portion of the gate pulse to the thyristor.

I claim:

1. A gating circuit for controlling the operation of a thyristor, including an output circuit, and circuit means operable to apply to said output circuit a control pulse having an initial peaked portion of one polarity for firing said thyristor, a second portion of substantially constant current and of said one polarity for maintaining conduction in said thyristor, a third portion of substantially constant current and of reverse polarity for maintaining the thyristor cutoff during a required period of nonconduction of the thyristor. said circuit means including a resistor and two transistors connected in series between opposite polarity power supplies, and a capacitor shunting said resistor with said control pulse being derived from a junction in the series circuit intermediate the transistors.

2. A circuit according to claim 1 in which said circuit means includes at least one network for developing said initial peaked portion of said control pulse, first and second supply means for providing said constant current of said one polarity and said other polarity, respectively, and switching means operable to select the required one of said supply means for connection to the output circuit.

3. A circuit according to claim 2, in which said switching means includes first and second switching devices connected, respectively, between said output circuit and said first supply means and between said output circuit and said second supply means, and in which two of said networks are connected, respectively, in the circuits of the switching devices.

4. A circuit according to claim 3, in which each said network comprises a RC network.

5. A circuit according to claim 3, in which said switching means includes a bistable circuit which operates said switching devices alternately.

6. A gating circuit for applying an operating pulse to a thyristor, including an output circuit, control means for developing first and second control signals, a bistable circuit operable to assume one or other states of conduction in dependence on the first and second signals respectively, pulse shaping means effective to apply to said output circuit an initial peaked portion of said operating pulse for firing said thyristor, a constant current stage operable in response to said one state of the bistable circuit to apply to the output circuit a substantially constant current second portion of said operating pulse for maintaining conduction in the thyristor, and operable in response to said other state of the bistable circuit to apply to the output circuit a substantially constant current third portion of said operating pulse, said third portion being of reversed polarity to maintain the thyristor cutoff during a required period of nonconduction of the thyristor, and control means to apply said first and second signals to the bistable circuit so that said initial, second and third portions together from a continuous control pulse.

7. A circuit according to claim 6, in which said constant current stage includes two transistor switching circuits for selecting the polarity of the output of said stage, and in which the pulse shaping means includes two RC networks connected, respectively, in the transistor switching circuits.

* * * * *